United States Patent [19]

Kishi et al.

[11] Patent Number: 5,302,542
[45] Date of Patent: Apr. 12, 1994

[54] METHOD OF MAKING A SEMICONDUCTOR MEMORY DEVICE

[75] Inventors: Koichi Kishi, Fujisawa; Shizuo Sawada, Urawa, both of Japan

[73] Assignee: Kabushiki Kaisha Toshiba, Kanagawa, Japan

[21] Appl. No.: 56,900

[22] Filed: May 5, 1993

[30] Foreign Application Priority Data

May 6, 1992 [JP] Japan .................................. 4-113377

[51] Int. Cl.⁵ .............................................. H01L 21/70
[52] U.S. Cl. ...................................... 437/52; 437/47; 437/60; 437/919
[58] Field of Search ................. 437/38, 47, 48, 52, 437/60, 203, 919; 257/301; 148/DIG. 12

[56] References Cited

U.S. PATENT DOCUMENTS

| | | | |
|---|---|---|---|
| 4,638,552 | 1/1987 | Shumbo et al. | 148/DIG. 12 |
| 4,837,186 | 6/1989 | Ohata et al. | 148/DIG. 12 |
| 4,914,628 | 4/1990 | Nishamura | 437/302 |
| 4,948,748 | 8/1990 | Kitahara et al. | 148/DIG. 12 |
| 4,988,637 | 1/1991 | Dhong et al. | 437/52 |
| 5,013,676 | 5/1991 | Horigome | 437/52 |
| 5,102,817 | 4/1992 | Chattarjee et al. | 437/52 |
| 5,102,819 | 4/1992 | Matsushita et al. | 437/47 |
| 5,204,282 | 4/1993 | Tsuruka et al. | 148/DIG. 12 |
| 5,238,865 | 8/1993 | Eguchi | 148/DIG. 12 |

FOREIGN PATENT DOCUMENTS

0004080  1/1984  Japan .................................. 437/915

*Primary Examiner*—Tom Thomas
*Attorney, Agent, or Firm*—Banner, Birch, McKie & Beckett

[57] ABSTRACT

A semiconductor substrate according to the present invention includes a first semiconductor substrate of a first conductivity type, an insulating film selectively formed in the first semiconductor substrate to define an exposed surface region, and a second semiconductor substrate of a second conductivity type opposite to the first conductivity type being bonded to the first semiconductor substrate. A DRAM cell formed by using the semiconductor substrate includes a trench capacitor formed in the first semiconductor substrate through both the second semiconductor substrate and the exposed surface region, and a transfer transistor formed in the second semiconductor substrate.

3 Claims, 3 Drawing Sheets

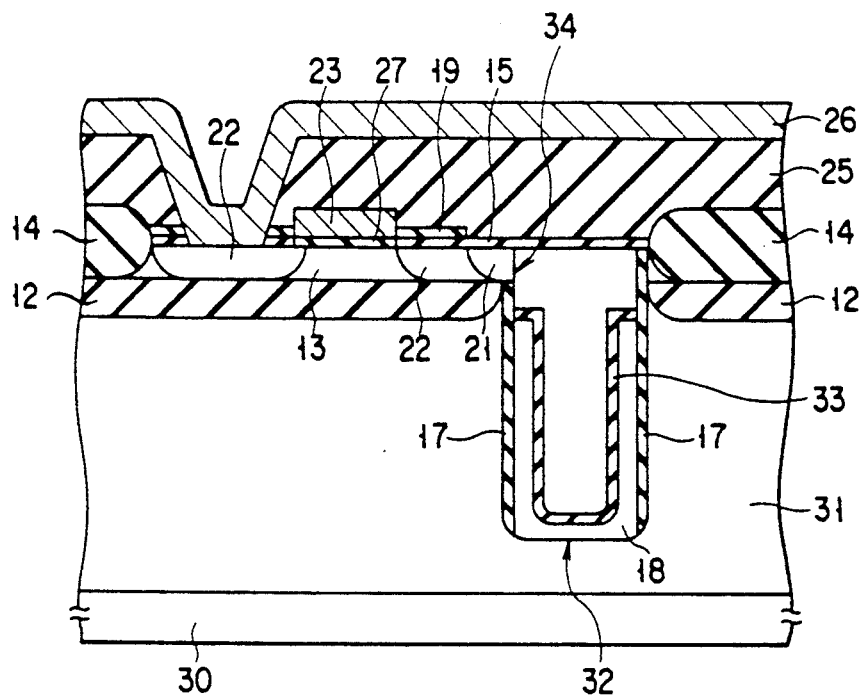
F I G. 7

5,302,542

METHOD OF MAKING A SEMICONDUCTOR MEMORY DEVICE

BACKGROUND OF THE INVENTION

1. Field of the Invention

The present invention relates to a semiconductor memory device and, more particularly, to a semiconductor memory device such as a one-transistor-one-capacitor type dynamic random access memory.

2. Description of the Related Art

A dynamic random access memory (DRAM) constituted by one-transistor-one-capacitor type memory cells has recently been improved rapidly in degree of integration and memory capacity, in virtue of the progress in semi-conductor technology, especially fine processing technology. There is a substrate plate trench (SPT) cell as a cell having a flat surface and a high capacitance of a capacitor.

The structure of the SPT cell will now be described, with reference to FIG. 8. A P-type epitaxial layer 52 is formed on P+-type silicon substrate 51 serving as a cell plate of the memory cell, and an N well region 53 is selectively formed in the P-type epitaxial layer 52. A trench 54 is formed so as to penetrate both the N well region 53 and the epitaxial layer 52 and reach the inside of the P+-type silicon substrate 51. The trench 54 is filled with P+-type polysilicon 56 serving as a storage node of the memory cell, with a gate insulating film 55 formed on the inner surface of the trench 54. A silicon oxide film 57 is selectively formed on the surface of the substrate. A P+-type diffusion layer 58 serving as a diffusion region of a PMOS transistor is formed in the N well region 53, and a P-type diffusion layer 59 serving as a plate electrode removing region is formed in the P-type epitaxial layer 52. The P+-type polysilicon 56 and P+-type diffusion layer 58 are electrically connected to each other by a conductive strap 60. A transfer gate 61 serving as a gate of the PMOS transistor is formed above the N well region 53 with an insulating film 62 interposed between them. Finally, a wiring layer 63 is selectively formed.

Since the SPT cell as shown in FIG. 8 is able to obtain a high capacitance of the capacitor in virtue of the trench 54 and the P+-type silicon substrate 51 serves as a cell plate, the SPT cell can be formed to have a flat surface. It is however evident that only the P+-type silicon substrate 51 contributes to the high capacitance of the capacitor and neither the P-type epitaxial layer 52 nor the N well region 53 contributes to the high capacitance of the capacitor.

The capacitance of the capacitor can be increased further by thinning the N well region 53 and the P-type epitaxial layer 52. However, a leak occurs owing to a parasitic FET in the longitudinal direction of the P+-type diffusion layer 58, N well region 53, and P-type epitaxial layer 52. If the N well region 53 is thinned while keeping a constant concentration, the sheet resistance of the N well region 53 is heightened, the potential of the N well region 53 locally becomes unstable, and the operation of the transfer gate 61 becomes unstable. As described above, the N well region 53 and P-type epitaxial layer 52 need to have a predetermined thickness, and they cannot be thinned too much.

Further, the plate electrode removing region has to be contacted, excepting where the N well region 53 is formed. Since, however, the N well region 53 is deep, the semiconductor memory device requires a region extended sufficiently in the lateral direction, which prevents the device from improving in high degree of integration.

SUMMARY OF THE INVENTION

An object of the present invention is to provide a semiconductor memory device suitable for forming memory cells with a high degree of integration.

Another object of the present invention is to provide a method for making the semiconductor memory device.

According to one aspect of the present invention, a one-transistor-one-capacitor type semiconductor memory device comprises a semiconductor substrate including a first semiconductor substrate of a first conductivity type, an insulating film selectively formed in the first semiconductor substrate to define an exposed surface region, and a second semiconductor substrate of a second conductivity type opposite to the first conductivity type being bonded the first semiconductor substrate. A trench capacitor includes a trench formed in the first semiconductor substrate through both the second semiconductor substrate and the exposed surface region, an insulating film provided over an inner wall of the trench, and a conductive layer of the first conductivity type formed in the trench. A transistor, which is adjacent to the trench capacitor and, is formed on the second semiconductor substrate insulated from the first semiconductor substrate by the insulating films. Plate contact of the trench capacitor is formed in that portion of the second semiconductor substrate which is directly coupled to the first semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The novel and distinctive features of the invention are set forth in the claims appended to the present application.

The invention itself, however, together with further objects and advantages thereof may best be understood by reference to the following description and accompanying drawings in which:

FIG. 7 is a cross-sectional view showing a semiconductor memory device according to another embodiment of the present invention.

DETAILED DESCRIPTION OF THE PREFERRED EMBODIMENTS

A semiconductor memory device and a method for making the same according to the present invention will now be described, with reference to the drawings.

Figure 1:
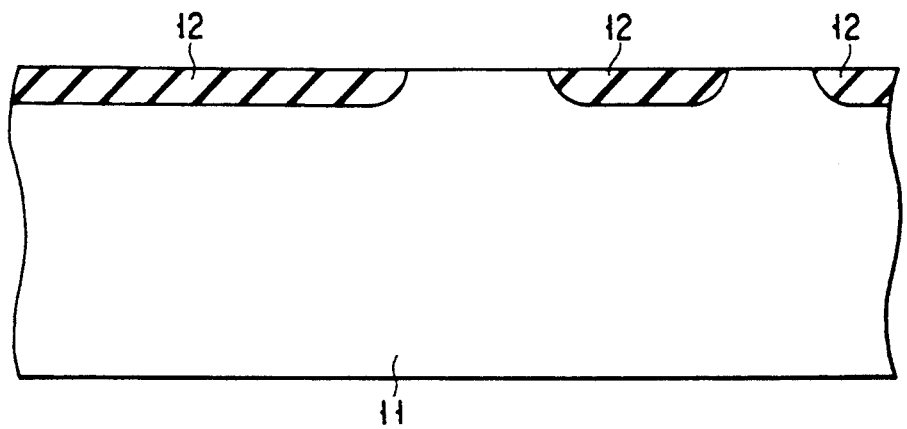
FIG. 1 is a cross-sectional view showing a first step of making a semiconductor memory device according to on embodiment of the present invention.
Figure 2:
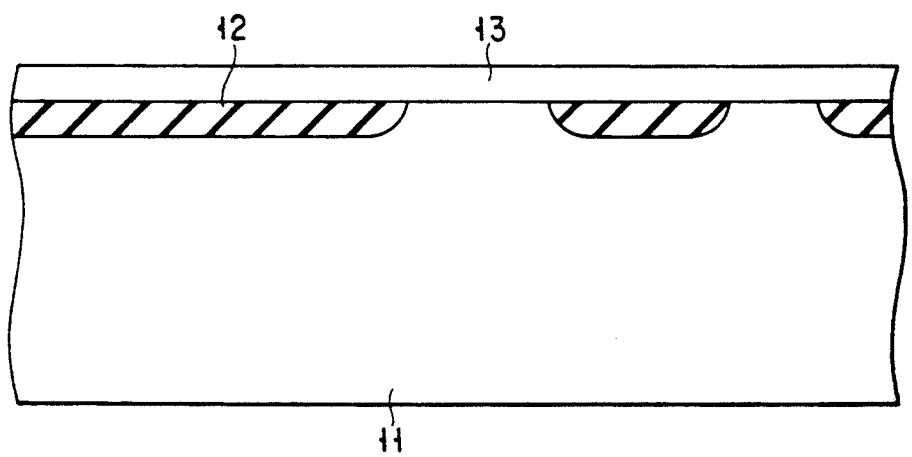
FIG. 2 is a cross-sectional view showing a second step of making the semiconductor memory device.

First a semiconductor substrate for forming the semiconductor memory device will be described with reference to FIGS. 1 and 2. A silicon oxide film 12 having a thickness of, e.g., 4000 Å is selectively formed on a P+-type silicon substrate 11 by Local Oxidation of Silicon (LOCOS). Then the surface of the P+-type silicon substrate 11 is flattened by polishing so that the surface of the silicon oxide film 12 is flush with the surface of the P+-type silicon substrate 11 on which the silicon oxide film 12 is not formed (FIG. 1).

After that, an N-type monocrystalline silicon substrate 13 is bonded to the P+-type silicon substrate 11, and the surface of the substrate 13 is polished so that its thickness becomes, for example, 2000 Å. A direct bonding (direct contact) method is used for adhesion of the substrate 13 to the substrate 11. The surfaces of both the substrates 11 and 13 are washed using a mixed liquid of sulfuric acid and hydrogen peroxide, and activated, and then dried, thereby bringing them into tight contact with each other. These substrates are thermally treated for an hour at 1100° C. in a nitrogen atmosphere containing 25% of oxygen. Since, in the direct bonding method, the surfaces of two substrates to be adhered need to have mirror finished surfaces of high degree of smoothness, the surfaces of the substrates 11 and 13 are polished so as to have mirror finished surfaces. The substrates 11 and 13 are bonded, resulting in a semiconductor substrate including the silicon oxide film 12 (FIG. 2).

Figure 3:
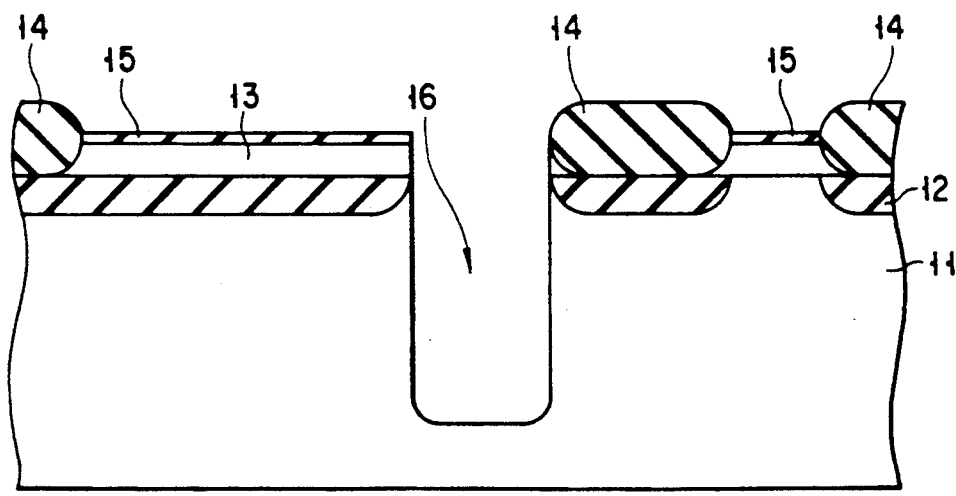
FIG. 3 is a cross-sectional view showing a third step of making the semiconductor memory device.

A semiconductor memory device having the semiconductor substrate shown in FIG. 2, will now be described, with reference to FIGS. 3 to 6. A LOCOS oxide film 14 having a thickness of, e.g., 4000 Å is selectively formed on the N-type monocrystalline silicon substrate 13 by the LOCOS, and a silicon oxide film 15 having a thickness of, e.g., 500 Å is deposited on the substrate 13 by Chemical Vapor Deposition (CVD). Thereafter, a trench 16 is formed in the P+-type silicon substrate 11 through both the silicon oxide film 15 and N-type monocrystalline silicon substrate 13 by photolithography and Reactive Ion Etching (RIE). The trench 16 is formed in that region of the P+-type silicon substrate 11 on which the silicon oxide film 12 is not formed (FIG. 3).

Figure 4:
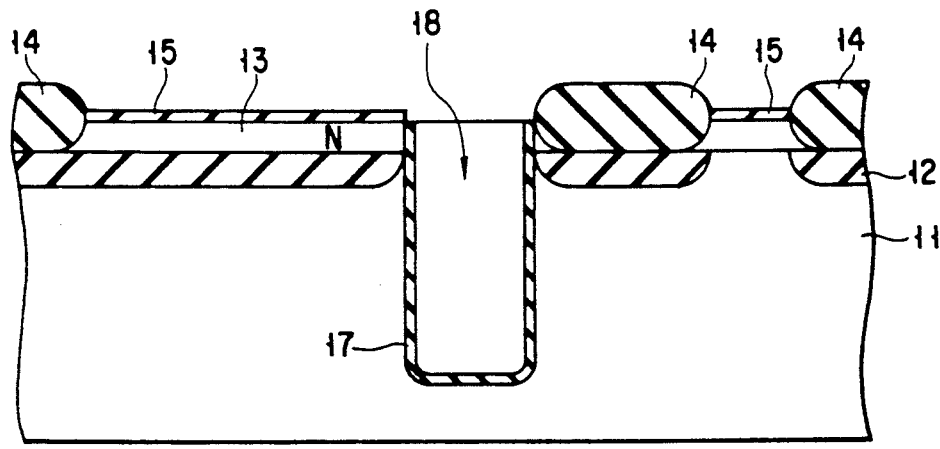
FIG. 4 is a cross-sectional view showing a fourth step of making the semiconductor memory device.

Next, a silicon nitride film having a thickness of, e.g., 80 Å is deposited in the trench 16 by the CVD, and a silicon oxide film having a thickness of, e.g., 20 Å is formed on the silicon nitride film, with the result that a gate insulating film 17 including a laminated film of the silicon nitride film and the silicon oxide film serving as a dielectric film of a capacitor. After that, boron-doped polysilicon having a thickness of, e.g., 4000 Å, which serves as a storage node of the capacitor, is deposited by the CVD. The boron-doped polysilicon deposited o the plane of the resultant substrate (on the region other than the trench 16) is removed by the photolithography and RIE, and a P-type polysilicon layer 18 is formed in the trench 16 (FIG. 4).

Figure 5:
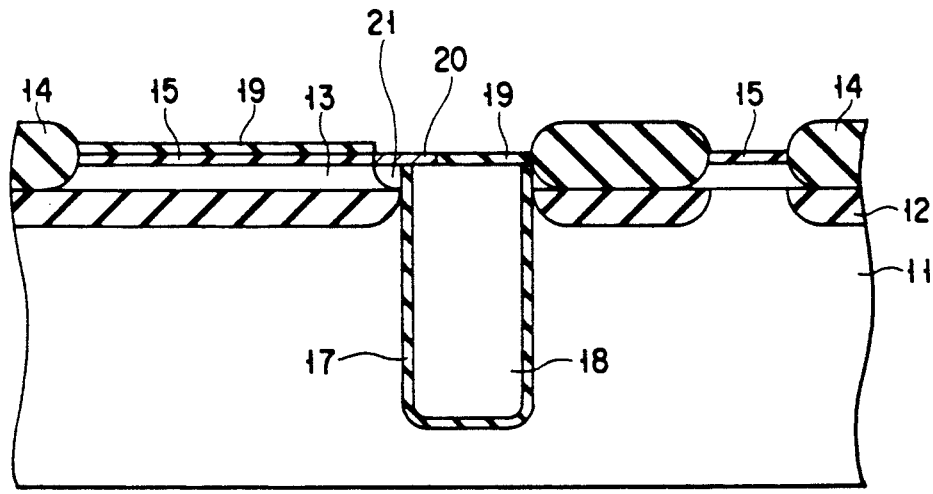
FIG. 5 is a cross-sectional view showing a fifth step of making the semiconductor memory device.

A silicon oxide film 19 having a thickness of, e.g., 500 Å is deposited on the surface of the resultant substrate by the CVD and then removed selectively by the photolithography and RIE, thereby to form an opening at a portion connecting the P-type polysilicon layer 18 and N-type monocrystalline silicon substrate 13. Subsequently to this, a boron-doped P-type epitaxial layer 20 having a thickness of, e.g., 500 Å is grown in the opening by selective epitaxial growth and, at the same time, a P-type diffusion layer 21 is formed in the N-type monocrystalline silicon substrate 13 contacting the P-type epitaxial layer 20 (FIG. 5).

Figure 6:
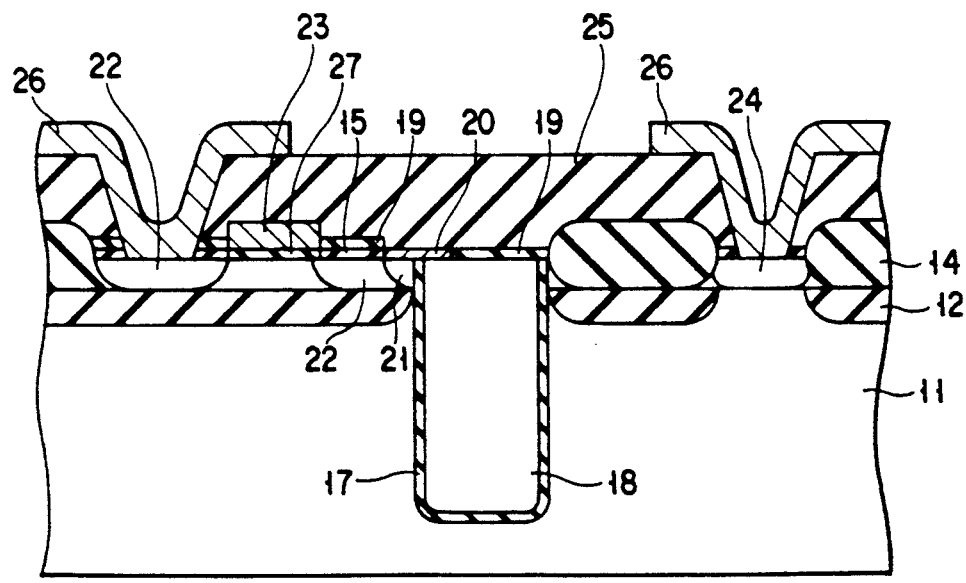
FIG. 6 is a cross-sectional view showing a sixth step of making the semiconductor memory device.
Figure 8:
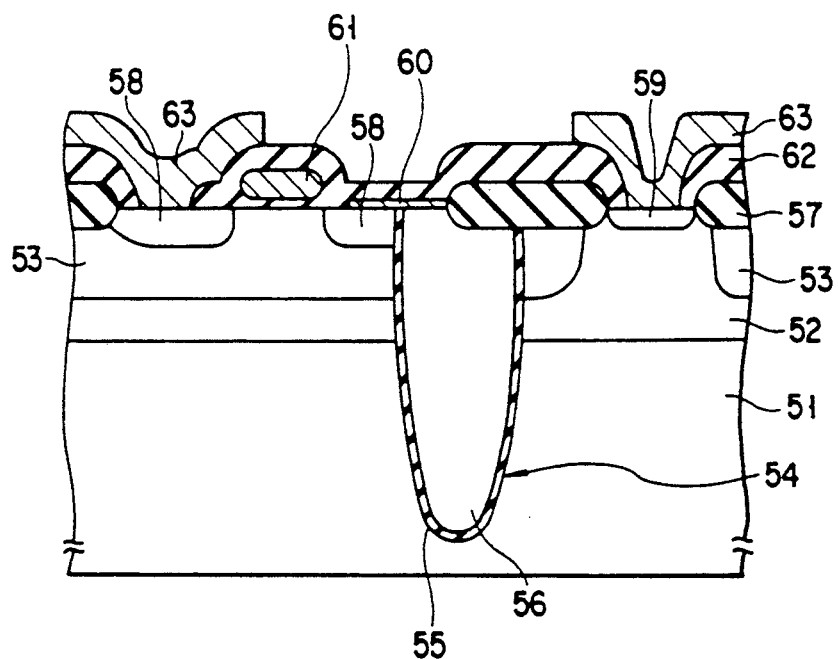
FIG. 8 is a cross-sectional view showing a conventional semiconductor memory device.

P-type diffusion layers 22 serving as source and drain regions of a PMOS transistor, are formed in the N-type monocrystalline silicon substrate 13, the silicon oxide films 15 and 19 are selectively removed from a region in which a transfer gate 23 is to be formed, and a gate oxide film 27 is formed therein by thermal oxidation, thereby forming the transfer gate 23. One of the P-type diffusion layers 22 contacts the P-type diffusion layer 21, and is electrically connected to the P-type polysilicon layer 18 through the P-type diffusion layer 21 and P-type epitaxial layer 20. Furthermore, a P-type diffusion layer 24 is formed as a plate electrode removing region in the N-type monocrystalline silicon substrate 13 and, in this case, it is formed on that portion of the P+-type silicon substrate 11 in which the silicon oxide film 12 is not formed. After that, an interlayer insulating film 25 and wiring layers 26 are formed on the resultant substrate, thus completing a substrate plate type memory cell (FIG. 6).

It is needless to say that the silicon oxide film 12 can be formed in the P+-type silicon substrate 11 by the following method. First, the P+-type silicon substrate 11 is selectively etched by the photolithography and RIE to form a trench having a depth of, e.g., 2000 Å, and then the silicon oxide film 12 having a thickness of, 4000 Å is deposited on the resultant substrate by the CVD. As in the above embodiment, the surfaces of the oxide film 12 and P+-type silicon substrate 11 are flattened.

Moreover, the thickness of the N-type monocrystalline silicon substrate can be determined by etching. More specifically, for example, a high-concentration P-type diffusion layer having a predetermined thickness ca be formed in advance in that surface of the N-type monocrystalline silicon substrate 13 to which the P+-type silicon substrate 11 is adhered, both the substrates are bonded to each other, and then the substrate 13 can be etched so as to reach the P-type diffusion layer. Consequently, the thickness of the N-type monocrystalline silicon substrate 13 can be controlled with fine precision, with the result that a semiconductor substrate having a thinner N-type monocrystalline silicon substrate can be formed.

In the above embodiment, the direct bonding method is used to adhere the P+-type silicon substrate 11 and N-type monocrystalline silicon substrate 13 to each other. However, it can be replaced with an electrostatic contact method for contacting two substrates by applying a voltage between them, and a method for bonding them using glass material, low fusing point metal, adhesive, or the like.

Furthermore, in the above embodiment, a laminated layer of silicon oxide film/silicon nitride film is used as a dielectric film of the capacitor. However, the laminated layer can be replaced with a laminated film of silicon oxide film/silicon nitride film/silicon oxide film, a Ta oxide film, a laminated film including a Ta oxide film, or the like.

A semiconductor memory device according to another embodiment of the present invention will now be described, with reference to FIG. 7. The descriptions of the same elements as those of the above embodiment are omitted. A P well region 31 is formed on an N-type silicon substrate 30, and a silicon oxide film 12 is selectively formed on the P well region 31. The N-type silicon substrate 30 having such a structure is bonded to an N-type monocrystalline silicon substrate 13. Furthermore, an insulating film 33 is formed in a trench to constitute a stacked type capacitor. A P-type polysilicon layer 18 is electrically connected to a P-type diffusion layer 22 by forming a P-type diffusion layer 21 and a storage node contact 34.

In the above embodiments, the memory cell is constituted by PMOS transistors, however, it is needless to say that the memory cell can be constituted by NMOS transistors.

According to the semiconductor substrate of the present invention, a substrate plate type trench cell can be constituted, without forming a conventional P-type epitaxial layer or N well region. Since the trench capacitor is formed in the P+-type silicon substrate 11, the capacitance of the capacitor can be increased. Since, moreover, the insulating film is formed in a region in which a transistor is to be formed and under the N-type monocrystalline silicon substrate, a leak, which conventionally occurred owing to a parasitic FET in the longitudinal direction, can be prevented. Further, the area of the plate electrode removing region can be reduced. In short, since the semiconductor substrate of the present invention requires neither a P-type epitaxial layer nor an N well region from which various problems arose conventionally, the memory capacity can be increased, and the area of the plate electrode removing region can be decreased, thereby achieving a semiconductor memory device having memory cells of high degree of integration.

It is further understood by those skilled in the art that the foregoing description is preferred embodiments and that various changes and modifications may be made in the invention without departing from the spirit and scope thereof.

What is claimed is:

1. A method for making a semiconductor memory device, comprising the steps of:
   selectively forming an insulating film in one surface of a first semiconductor substrate of a first conductivity type to define an exposed surface region;
   bonding a second semiconductor substrate of a second conductivity type, opposite to the first conductivity type, to the surface of the first semiconductor substrate;
   forming a trench in the first semiconductor substrate through both the second semiconductor substrate and the exposed surface region;
   forming a dielectric film over an inner wall of the trench;
   forming a conductive layer of the first conductivity type in the trench;
   forming source and drain regions of the first conductivity type in the second semiconductor substrate;
   forming a gate insulating film on the second semiconductor substrate; and
   forming a gate electrode on the gate insulating film.

2. The method according to claim 1, wherein the second semiconductor substrate is bonded to the first semiconductor substrate after planarizing the surface of the first semiconductor substrate.

3. The method according to claim 1, wherein the second semiconductor substrate is bonded to the first semiconductor substrate after forming a plurality of grooves in the first semiconductor substrate, depositing an insulator over the substrate surface, and planarizing the substrate surface.

* * * * *